(12) United States Patent
Hou et al.

(10) Patent No.: US 12,508,685 B2
(45) Date of Patent: Dec. 30, 2025

(54) SEMICONDUCTOR DEVICE FABRICATION METHODS AND DEVICES FOR FORMING THE SAME

(71) Applicant: TAIWAN SEMICONDUCTOR MANUFACTURING COMPANY, LTD., Hsinchu (TW)

(72) Inventors: Te-Chien Hou, Hsinchu (TW); Chih Hung Chen, Hsinchu (TW); Chi-hsiang Shen, Hsinchu (TW); Yu-Heng Cheng, Hsinchu (TW); Shich-Chang Suen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 287 days.

(21) Appl. No.: 18/140,444

(22) Filed: Apr. 27, 2023

(65) Prior Publication Data
US 2024/0359287 A1    Oct. 31, 2024

(51) Int. Cl.
*B24B 37/26* (2012.01)
*B24B 37/04* (2012.01)
(Continued)

(52) U.S. Cl.
CPC ............ *B24B 37/26* (2013.01); *B24B 37/042* (2013.01); *B24B 37/10* (2013.01); *B24B 37/22* (2013.01);
(Continued)

(58) Field of Classification Search
CPC ....... B24B 37/26; B24B 37/042; B24B 37/10; B24B 37/22; B24B 37/24; H01L 21/304; H01L 21/31053
See application file for complete search history.

(56) References Cited

U.S. PATENT DOCUMENTS

| | | | | | |
|---|---|---|---|---|---|
| 5,913,713 | A | * | 6/1999 | Cheek | ..................... B24B 37/26 451/6 |
| 6,435,942 | B1 | * | 8/2002 | Jin | ...................... H01L 21/3212 257/E21.244 |

(Continued)

FOREIGN PATENT DOCUMENTS

| CN | 215470444 U | * | 1/2022 | |
|---|---|---|---|---|
| CN | 116922262 A | * | 10/2023 | ............. B24B 37/22 |

(Continued)

OTHER PUBLICATIONS

Chemical-Mechanical Planarization of Semiconductor Materials. (2013). Germany: Springer Berlin Heidelberg.

*Primary Examiner* — Jeffrie R Lund
(74) *Attorney, Agent, or Firm* — NZ Carr Law Office

(57) ABSTRACT

A chemical mechanical polishing device is provided according to some embodiments. The chemical mechanical polishing device comprises a polishing pad. The polishing pad includes a plurality of stacks of first pad fractions and a plurality of stacks of second pad fractions. The first pad fractions and the second pad fractions have different hardness. The stacks of first pad fractions and the stacks of the second pad fractions are arranged with a pattern corresponding to a predetermined feature of a structure to be polished by the chemical mechanical polishing device. The predetermined feature may include a surface profile or a material of the structure to be polished.

20 Claims, 17 Drawing Sheets

(51) Int. Cl.
*B24B 37/10* (2012.01)
*B24B 37/22* (2012.01)
*B24B 37/24* (2012.01)
*H01L 21/304* (2006.01)
*H01L 21/3105* (2006.01)

(52) U.S. Cl.
CPC ............ *B24B 37/24* (2013.01); *H01L 21/304* (2013.01); *H01L 21/31053* (2013.01)

(56) References Cited

U.S. PATENT DOCUMENTS

| | | | |
|---|---|---|---|
| 12,408,314 B2 * | 9/2025 | Lin | H10B 10/12 |
| 2006/0079159 A1 * | 4/2006 | Naujok | B24D 7/14 |
| | | | 451/526 |
| 2006/0094338 A1 * | 5/2006 | Kim | B24B 37/24 |
| | | | 451/7 |
| 2023/0398659 A1 * | 12/2023 | Hou | B24B 37/26 |
| 2024/0316724 A1 * | 9/2024 | Hsiao | B24B 51/00 |
| 2024/0359287 A1 * | 10/2024 | Hou | B24B 37/22 |
| 2024/0371648 A1 * | 11/2024 | Kung | B24B 53/017 |

FOREIGN PATENT DOCUMENTS

| | | | |
|---|---|---|---|
| KR | 20040058792 A | * | 7/2004 |
| KR | 20050067477 A | * | 7/2005 |
| TW | 201725091 A | | 7/2017 |
| TW | 202212054 A | | 4/2022 |
| TW | I889152 B | * | 7/2025 |

\* cited by examiner

SEMICONDUCTOR DEVICE FABRICATION METHODS AND DEVICES FOR FORMING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

In pursuit of higher device density, higher performance, and lower costs, challenges from both fabrication and design issues have resulted in the development of three-dimensional designs, such as a multi-gate field effect transistor (FET), including a nanosheet FET. One of the challenges arising from the increased number of interconnect layers in a given IC involves with chemical-mechanical polishing (CMP) process which is often used to selectively remove high elevation features by a combination of mechanical polishing and chemical reaction.

In the 3 nm or lower regime, In the traditional CMP system, increasing planarization efficiency (PE) with decreased CMP-induced defect plays a critical role in the fabrication process. Unfortunately, in the traditional CMP system, increasing the planarization efficiency often results in more CMP-induced defects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
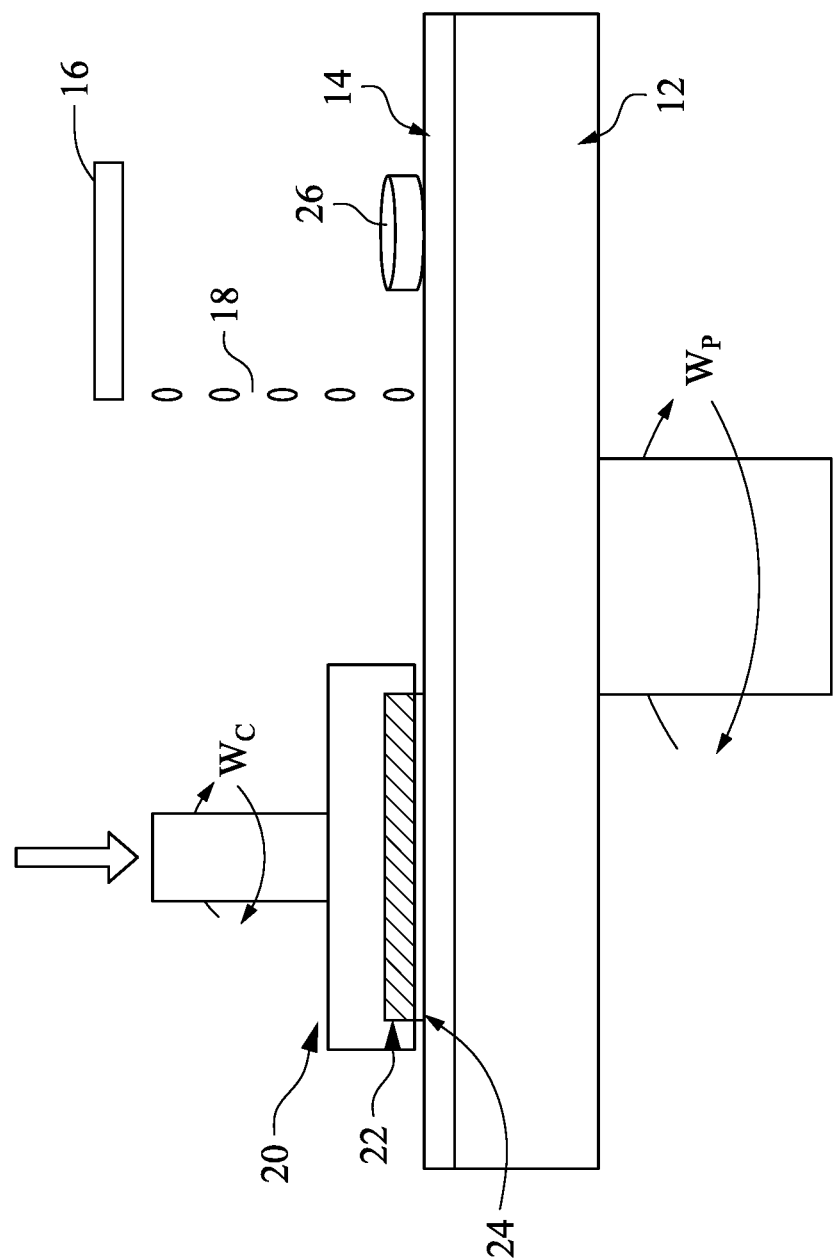
FIG. 1 shows a side view of a CMP device.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Fabrication of complex devices involve multiple semiconductor steps such as lithography, etch, metal deposition, and CMP. CMP is an enabler for the transition from planar to 3D device integration of both logic and memory chips, each of which has multiple CMP passes. The CMP process removes and planarizes excess material on the front surface of the wafer by applying downward force across the backside of the wafer and pressing the front surface against a rotating pad of special material that contains a mixture of chemicals and abrasive materials. The CMP application includes shallow trench isolation (STI), inter-layer dielectric (ILD), tungsten interconnect, copper damascene, and other existing or new emerging applications.

FIG. 1 shows an exemplary CMP device used in the planarization process. The CMP device 10 includes a platen 12 which may be driven to rotate with an angular speed $w_p$. A polishing pad 14 is disposed on the front surface of the platen 12. A slurry supply 16 is place above the platen 12 to supply slurry 18 on the polish pad 14 disposed on front surface of the platen. To polish a surface of a wafer 24, the CMP device 10 includes a wafer carrier 20 to retain the wafer 24 on a carrier film 22 within the wafer carrier 20. As shown in FIG. 1, the wafer 24 may be driven by the wafer carrier 20 to rotate with an angular speed $w_c$. The wafer carrier 20 may hold the wafer 24 with the use of vacuum during planarization to keep the wafer 24 on place and with either a removal retaining ring or a wafer guide to avoid dislodgement. In some embodiments, the CMP device 10 may include multiple wafer carriers 20 to planarize multiple wafers at the same time.

In some embodiment, the polishing pad 14 is circular and the wafer 24 is placed with its face down and forced against the polishing pad 14. The platen 12 is rotated on its own axis, and the wafer 24 is driven by rotating the wafer carrier 20 at its axis. The forces applied through the wafer carrier 20 on the wafer 24 may be adjustable within a predetermined range of, for example, 1 to 10 psi. The force applied through the wafer carrier 20 on the wafer 24 may be adjusted to suit the material being polished. To polish an oxide material, the higher end of the range is applied, while metal polishing is performed with the force in the lower end of the range. An important element of a CMP process is to have well controlled pressure applied uniformly over the wafer 24 and well controlled rotation rates of the wafer carrier 20 and the platen 12, $w_c$ and $w_p$ respectively. The slurry 18 is dispensed from the tube-like slurry supply 16 in front of the wafer 24, so that when the platen 12 is rotated, the slurry 18 is pulled under the wafer 24. The bottom of the retaining ring of the wafer carrier 20 may be recessed from the plane of the bottom of the wafer 24 in some embodiments.

Figure 2:
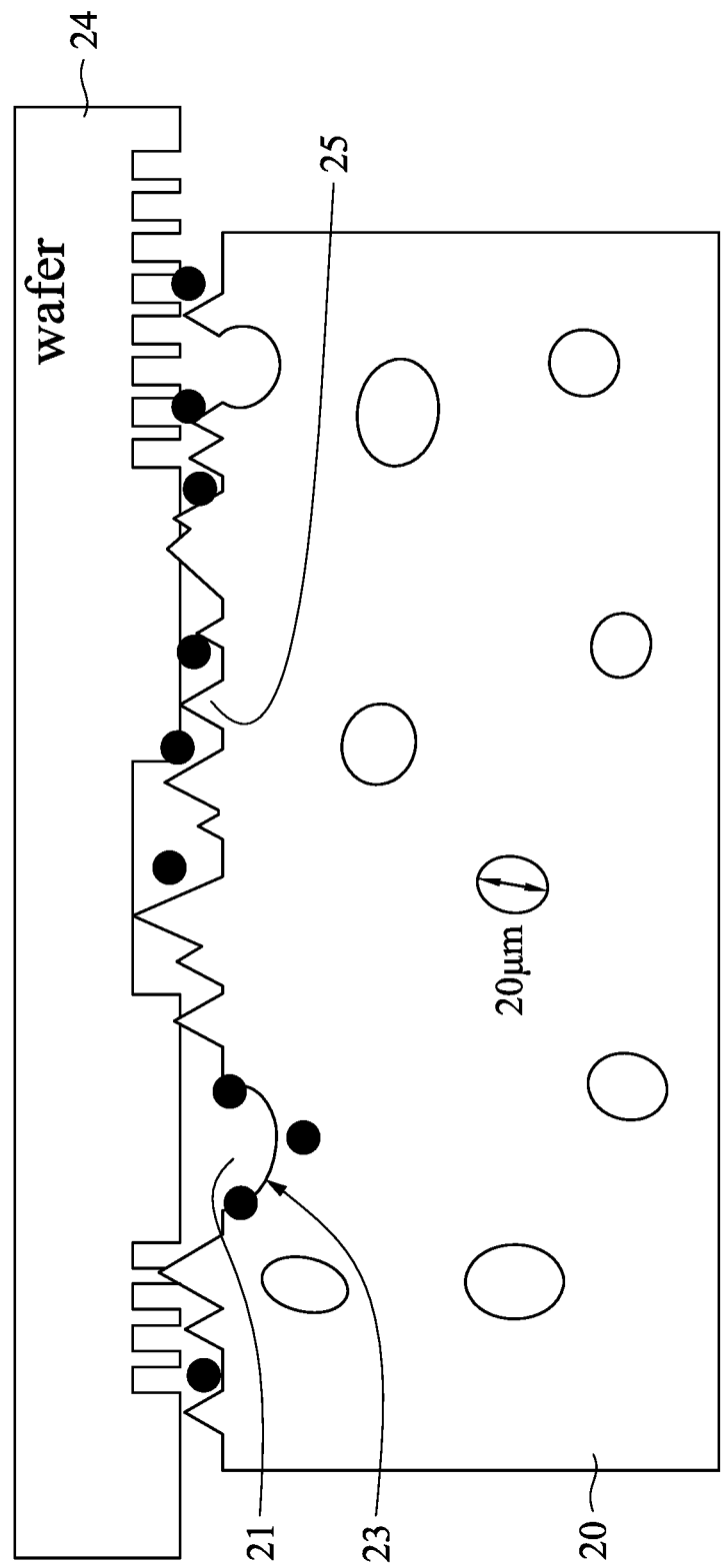
FIG. 2 shows the polishing mechanism of the CMP device as shown in FIG. 1.

The surface of the polishing pad 14 provides two functions of material removals. The first function is to delivery slurry 18 to the material removal region and remove byproduct. The second function is to exert pressure on individual material regions of the wafer 24. As shown in FIG. 2, the polishing pad 14 may include pores 21 to perform the first function. The wall structures 23 between the pores 21 may perform the second function. Two-body abrasion at the contact regions between the wafer 24 and the asperities 25 formed on the wall structures 23 appears to be the main material removal mechanism in the CMP process using abrasive slurry 18. Because of the irregular and non-uniform size and shape of the pores 21 and rough cutting surface of the wall structure 23 of the polish pad 14, contact areas for the two-body abrasion have non-uniform shape and size.

The CMP device 10 may further include a conditioner 26 that moves a hard abrading surface, often a matrix with embedded diamond points, across the pad surface to roughen the polishing pad 14. The conditioner 26 may determine the intrinsic asperity of the polishing pad 14, so as to maintain surface stability through the removal of worn surface material and restoration of the intrinsic structure. The conditioning process is critical to CMP process as an inadequately roughened pad 14 may result in a very low polishing rate. It has been shown that, in CMP, surface topologies of the polishing pad 14 play a key role as they transmit normal force and impart tangential motion to the hard, nano-scale abrasive particles in the slurry 18.

Figure 3:
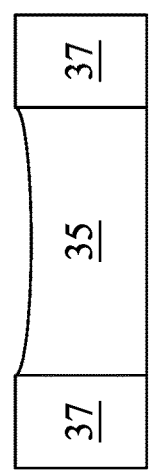
FIG. 3 is a cross-sectional view showing the surface of a semiconductor device being planarized by CMP.

Various types of polishing pads have been developed for dielectric CMP, polysilicon CMP, and metal CMP. The polishing pad may be made of the same material such as acrylic, polyurethane (PU), polyimide, and the like. Harder pads such as urethane-based pads may be capable of producing polished surfaces with longer range of planarization. In contrast, when a softer pad is used for CMP, the pressure of polishing may deform the softer pad into the wafer surface, dishing may occur. For example, as shown in FIG. 3, the softer pad is deformed with a central portion closer to the wafer placed underneath. The deformation of the softer pad causes the central portion of the surface of the oxide layer 35 recessed from the silicon layer 37 surrounding the oxide layer 35. The dishing effect may also occur to metal materials while using a softer pad in the CMP process.

Figure 4:
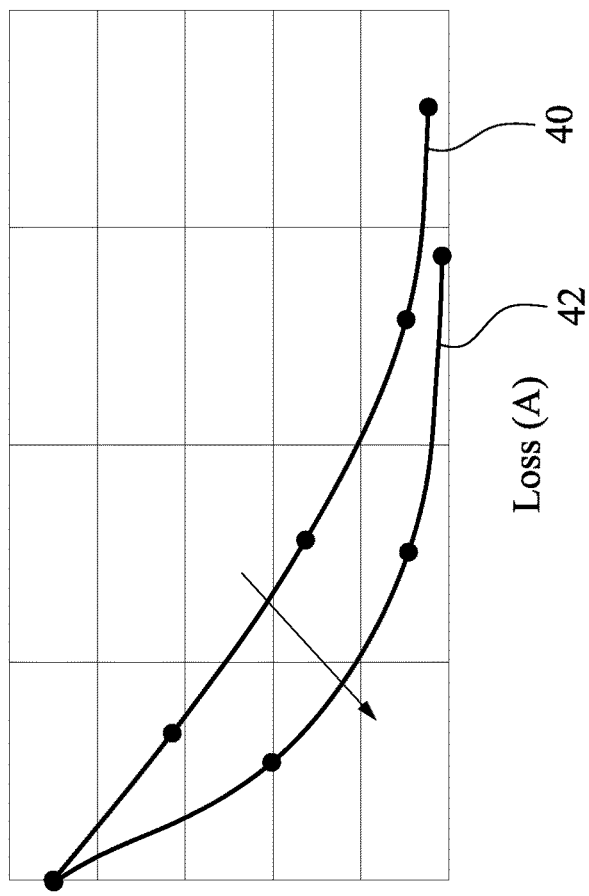
FIG. 4 shows the material removal at various step height in a CMP process using polishing pads with two different hardness.

FIG. 4 shows loss of oxide layer at various step height of the wafer by the CMP process using two polishing pads with different hardness. The curve 40 shows the oxide loss using a polishing pad with a hardness smaller than that of the polishing pad resulting the oxide loss represented by the curve 42. The arrow across two curves 40 and 42 shows that the loss of the oxide layer at a lower step height is reduced by increasing the hardness of the polishing pad. For example, at the step height of 1000 Å, the loss of oxide may be about 800 Å with a softer pad, while the loss oxide may be about 300 Å using a harder pad. The loss of oxide at the lower step height shows that the dishing effect is more significant using a softer pad.

Ideally, the removal rate of the oxide layer 35 within the trench as shown in FIG. 3 should be zero, and the removal rate (RR) of the active oxide layer, that is, the oxide outside of the trench should be 100%. The planarization efficiency (PE) for STI formation may be presented by:

$$PE = \frac{(\text{Active oxide } RR - \text{Trench Oxide } RR) \times 100}{\text{Active oxide } RR}.$$

With a low planarization efficiency, the thicker deposition film is needed, thus leads to raised manufacturing cost and lowered throughput (wafer per hour (WPH)).

Figure 5:
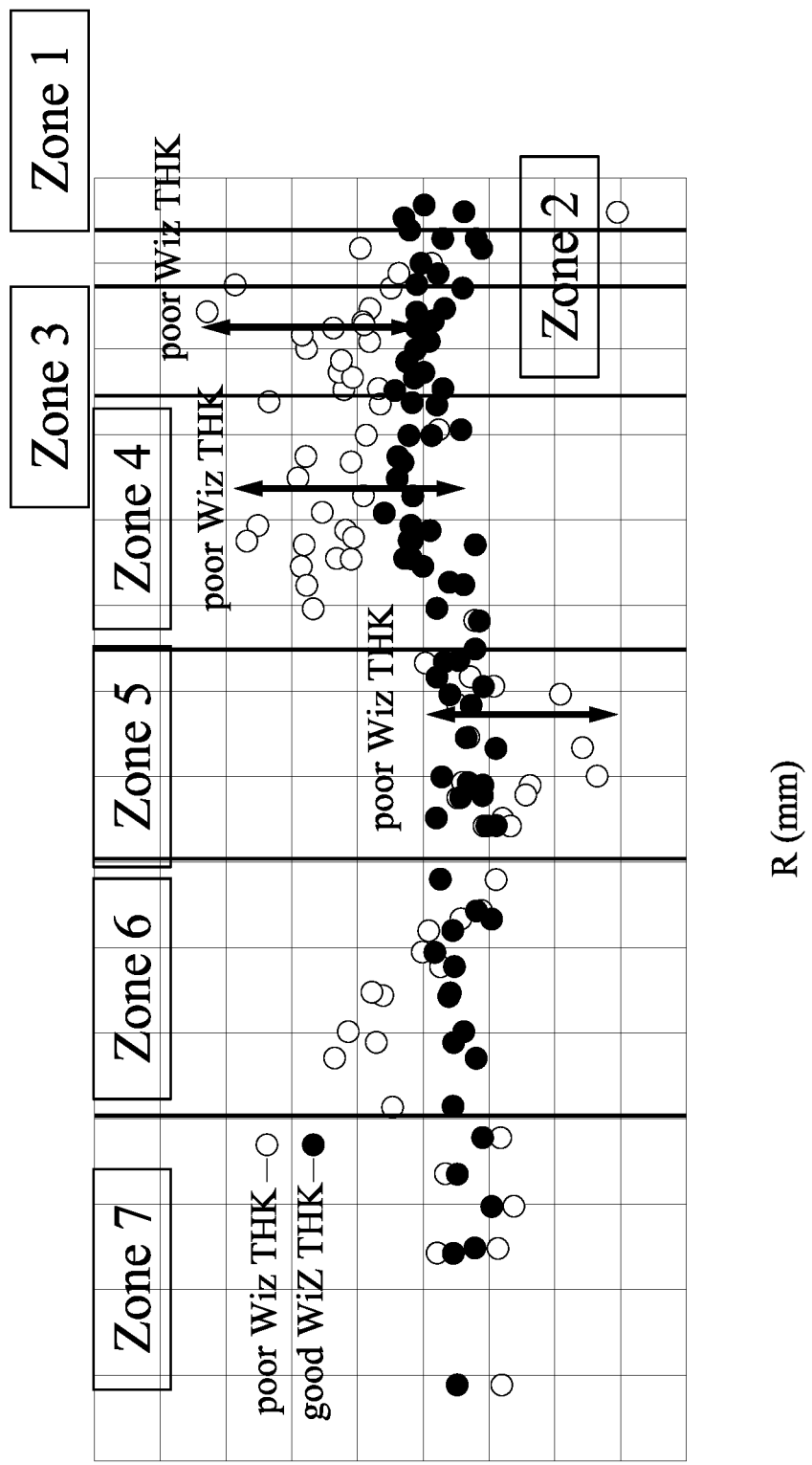
FIG. 5 is a graph showing the polishing uniformity in each radial zone of a wafer.

The dishing effective effect may be improved or resolved by using a harder pad, such that the planarization efficiency can be enhanced. However, harder pad inevitably introduces more CMP-induced defects. The increased defects may cause significant within zone (WiZ) nonuniformity and lower the yield; and consequently, cause device degradation. In CMP operation, multiple polishing radial zones along the radius of the wafer may be defined. The zone-to-zone polishing uniformity may be maintained by controlling the downward force applied from zone to zone, the materials of the slurry, the rotation speeds $w_c$ and $w_p$, and other parameters. However, as the downward force, the materials of the slurry, and the rotation speeds $w'_c$ and $w'_p$ applied in the same zone are the same, the within-zone uniformity cannot be improved in the same manner for maintaining the zone-to-zone polishing uniformity. As shown in FIG. 5, multiple zones (Zone 1 to Zone 7) have been defined based on its radial location on a wafer. In FIG. 5, the within-zone (WiZ) nonuniformity becomes more and more significant as the radial location is more distant from the central axis of the wafer.

Figure 6:
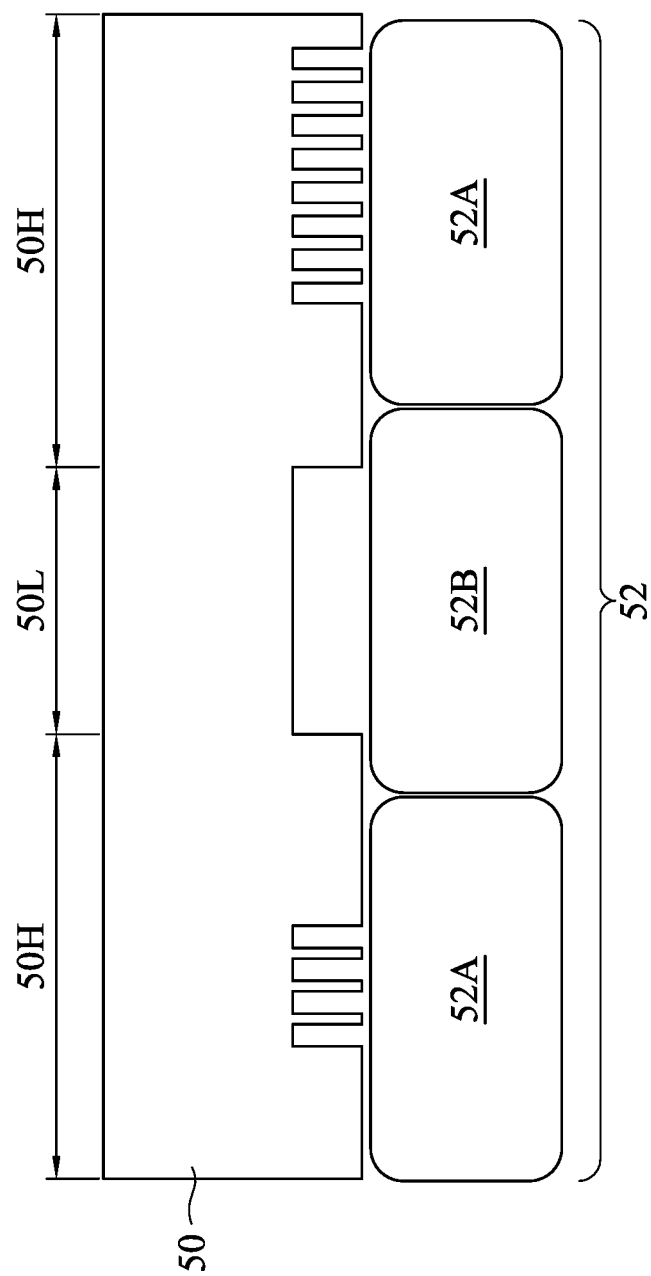
FIG. 6 is a side view of a polishing pad according to one embodiment.

The pattern density is also an important factor that may affect the dishing effect. The removal rate of the oxide layer (or other materials to be planarized) in the region with higher pattern density tends to be slower than the removal rate of the oxide layer (or other materials to be planarized) in the region with lower pattern density. In other words, the dishing effect is more significant in the region with lower pattern density than in the region with higher pattern density. FIG. 6 shows a polishing structure that may effectively prevent the region with lower pattern density from dishing without introducing significant CMP-introduced defects. As shown in FIG. 6, the polishing pad 52 is in the form of an array of multiple stacks of pad fractions 52A and 52B. The pad fractions 52A aligned under the wafer region 50H with higher pattern density are made of softer material compared to the material used for forming the pad fraction 52B aligned with wafer region 50L with lower pattern density. The softer pad fractions 52A prevents from introducing significant defects in the wafer region 50H with higher pattern density during the CMP process, while the harder pad 52B minimizes the dishing effect at the wafer region 50L with lower pattern density by CMP process.

Figure 7:
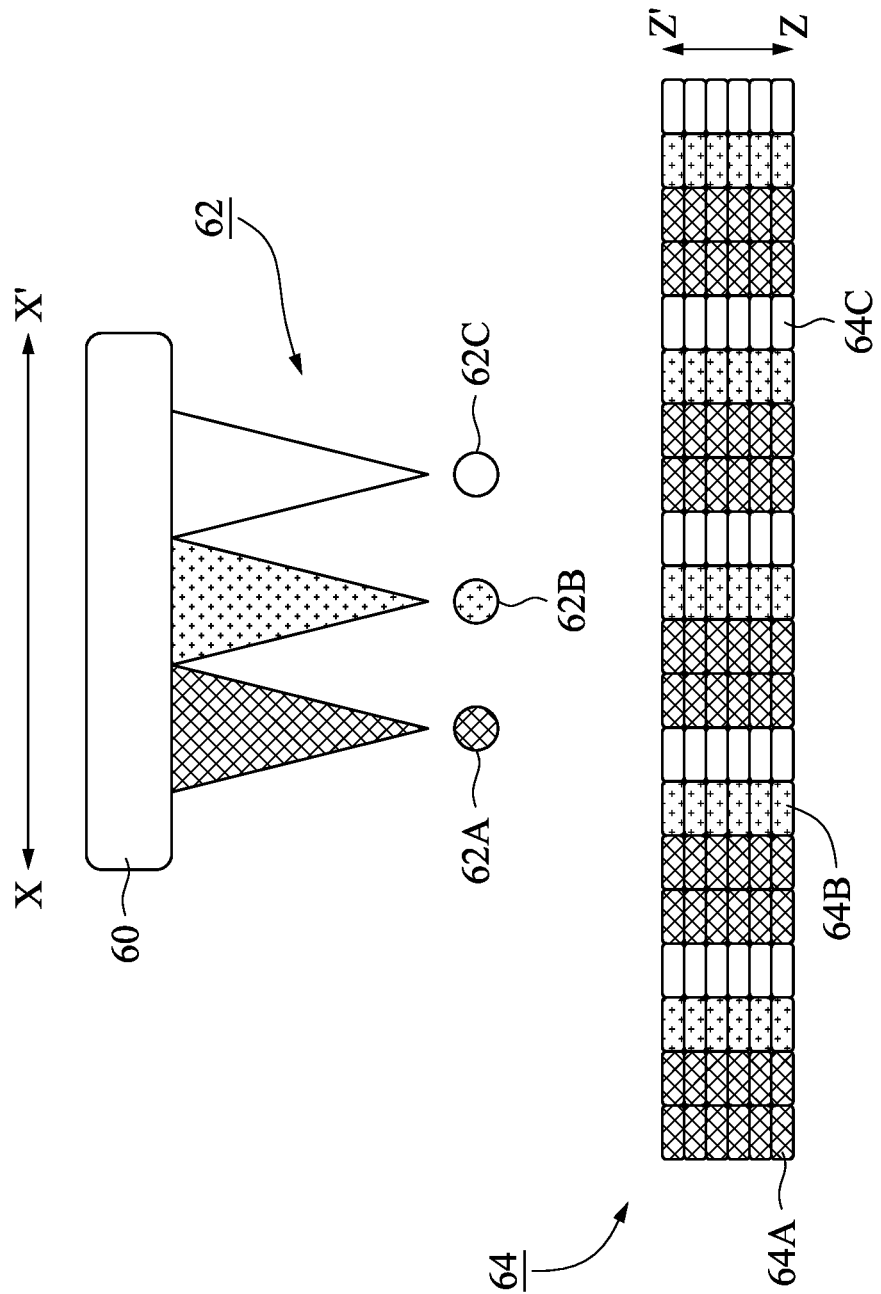
FIG. 7 shows the formation of a polishing pad according to one embodiment.

Instead of forming the bulk polishing pad made from the same material with the traditional process, as shown in FIG. 6, the polishing pad 52 (polishing pads according to the present disclosure) may be made with different hardness at different areas. This allows the polishing pad to be generally soft and locally hard. The different hardness may be achieved by using different materials or the same materials formed with different characteristics. In the embodiment as shown in FIG. 7, 3D printing is used to form the polishing pad as a stack of segments or fractions. By depositing each of the pad materials 62 individually and then stacking each layer of the pad fractions 64 with each other, the hardness of polishing pad may be controlled at a pixel level. In one embodiment, three types of pad fractions 64 may be formed within a polishing pad fraction 64, including a hard pad fraction 64A, a soft pad fraction 64B, and a pore pad fraction 64C. The hard pad fraction 64A has a larger hardness compared to the soft pad fraction 64B. The pore pad fraction 64C is made of water dissolvable materials to become a pore when water (liquid) is applied to the polishing pad 64.

As shown in FIG. 7, three types of filaments may be deposited from a 3D printer 60. The filaments, that is, the pad materials 62, may include the hard pad material 62A for forming the hard pad fractions 64A, soft pad material 62B for forming soft pad fractions 64B, and pore material 62C for forming pores 64C. The 3D printer 60 moves along X-direction and Y-direction (a direction in and out of the paper perpendicular to both X-X' and Z-Z' in FIG. 7) to form a pad layer of an array of the soft pad fractions 64A, hard pad fractions 64B, and the pore fractions 64C on the X-Y surface at a Z-level along the arrows Z-Z'. The same process is repeated at various Z-levels to form multiple pad layers along the z-axis. The pad layers at various Z-levels are stacked with each other to form the three-dimensional (3D) polishing pad 64.

In the current embodiment, two hard-pad fraction 64A, one soft-pad fraction 64B, and one pore fraction 64C are formed in sequence repeated along the X-direction. The arrangement or sequence for forming the hard-pad fraction 64A, the soft-pad fraction 64B, and the pore fraction 64C along the Y-direction may be the same as or different from the arrangement along the X-direction. In the current embodiment, the same pattern of the hard pad fraction 64A, the soft pad 64B, and the pore fraction 64C is arranged of each pad layer. That is, as shown in FIG. 7, the polishing pad 64 includes an array of multiple stacks of hard pad fractions 64A, multiple stacks of soft pad fractions 64B, and multiple stacks of pore pad fractions 64C.

Figure 8:
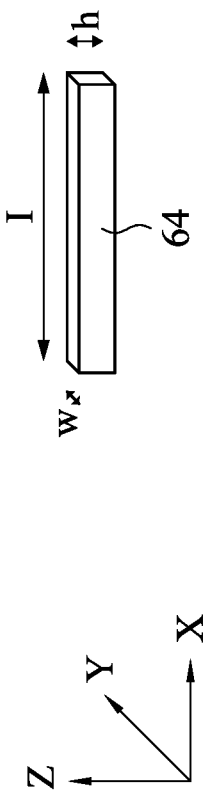
FIG. 8 shows the dimension of each fraction of the polishing pad as shown in FIG. 7.

FIG. 7 shows the polishing pad 64 along the X-Z plane. FIG. 8 shows a perspective view of any one of the pad fractions 64A, 64B, and 64B as shown in FIG. 7. In one embodiment, each of the pad fractions 64A, 64B, and 64C may be in the shape of a rectangular prism with a length l, a width w, and a height h as shown in FIG. 8. The hard pad fraction 64A may have a length $l_H$ ranging from about 1 μm to 1000 μm and a width $w_H$ ranging from about 1 μm to about 1000 μm. The height of the hard pad fraction 64A may ranges from about 1 μm to about 100 μm. The soft pad fraction 64B may have a length $l_S$ ranging from about 1 μm to about 1000 μm, a width $w_S$ ranging from about 1 μm to about 1000 μm, and a height $h_S$ ranging from about 1 μm to about 100 μm. The pore pad fraction 64C may have a length $l_P$ ranging from about 1 μm to about 1000 μm, a width $w_P$ ranging from about 1 μm to about 1000 μm, and a height $h_P$ ranging from 1 μm to about 100 μm. The hardness of the hard pad fraction 64A may range from about 40 Shore D to about 90 Shore D, and the hardness of the soft pad fraction 64B may range from about 30 Shore D to about 70 Shore D according to some embodiments. The pore fraction 64C may be water soluble hollow ball.

As discussed above, defect-free planarization without scratch or defect generation is crucial for achieving high yield rates as well as precise control of within-zone uniformity (WiZ) in material removal. Manufacturing efficiency depends on two key factors. First, the material removal rate (MRR) must be maximized for a given cycle time. Second, the amount of CMP slurry, polishing pad, and conditioner use must be minimized to improve cost efficiency. The material removal rate is proportional to relative velocity v between the wafer to be planarization and the polishing pad, the polishing pressure p, and the Preston's coefficient k according to Preston's law as:

$$MRR = k \times p \times v.$$

The Preston's law predicts that the material removal rate increases by increasing the relative speed v, the polishing load (pressure p), and the Preston's coefficient k. Preston's coefficient k is affected by several process factors, including the functionality of the physical contact of abrasive and chemicals. As described earlier in this specification, materials are removed by the contact of nanoscale abrasives with chemically altered material surfaces. Hence, the material removal mechanics of nano-abrasives directly affect the efficiency of material removal. The surface asperities of the polishing force apply polishing force to actively working abrasives. Thus, the functionality of pad surface asperity is significant as well.

Figure 9:
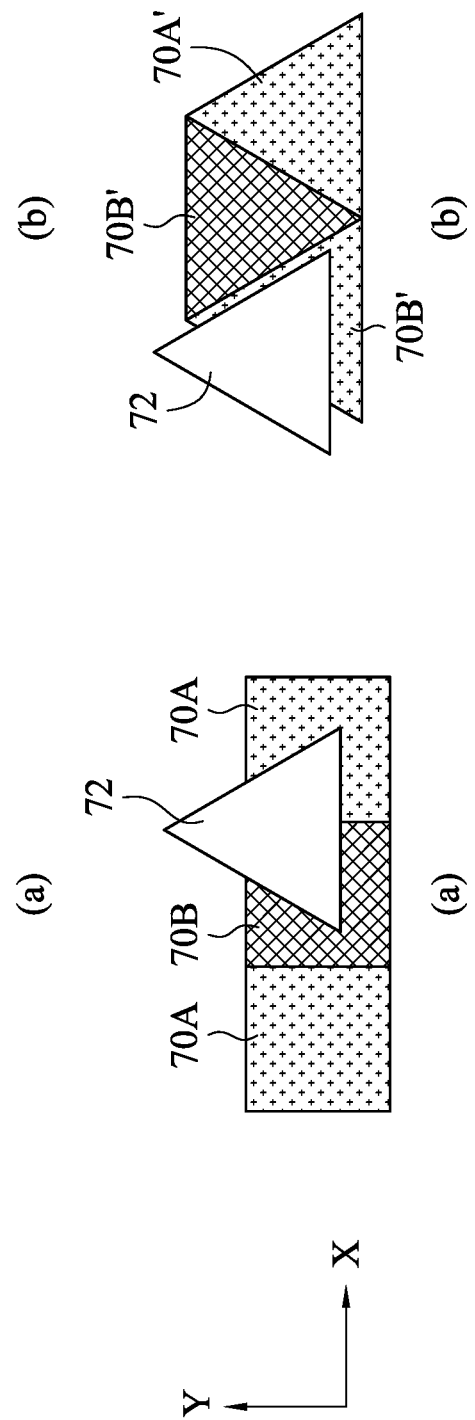
FIG. 9 shows the top view of a nanostructure to be polished using the polishing pads with two different shapes.

In FIGS. 9(a) and 9(b), two polishing pad structures are made of pad fractions in different shapes on the X-Y plane. Each of the polishing pads includes two stacks of pad fractions 70A and 70A' with a first hardness and one stack of pad fraction 70B and 70B' with a second hardness. The stacks of pad factions 70B and 70B' are sandwiched between the stacks of pads 70A and the pads 70A', respectively. In some embodiment, the first hardness is different from the second hardness. For example, when the pad fraction 70B and 70B' is to be aligned for polishing a wafer area with lower pattern density and the pad fractions 70A and 70B' is to be aligned with a wafer area with a higher pattern density during CMP process, the first hardness is smaller than the second hardness. In design (a) shown in FIG. 9, each of the stacks of pad fractions 70A and 70B has a rectangular front surface extending along the X-Y plane, while each of the stacks of pad fractions 70A' and 70B' in design (b) in FIG. 9 has a triangular front surface extending on the X-Y plane. While polishing a wafer with a nanostructure 72 in triangular shape as shown in FIG. 9, the stacks of pad fractions 70A and 70B with the rectangular asperity of the polishing pad fraction results in a non-uniform contact between the wafer and the polishing pad. In contrast, by configuring the pad asperity with a triangular profile, a uniform contact between the wafer and the polishing pad can be obtained as shown in FIG. 9(b). Therefore, the shape of the front surface of each of the pad fractions of the polishing pad may be configured with reference to the nanostructure 72 of the wafer to be planarized to reduce the CMP-induced defects and to enhance the polishing uniformity.

Figure 10:
FIG. 10 shows various shapes of the pad fractions of the polishing pad.
Figure 10:
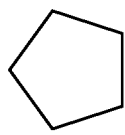
Figure 10:
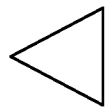
Figure 10:
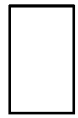
Figure 10:
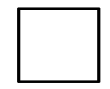
Figure 10:
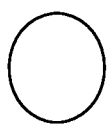
Figure 10:
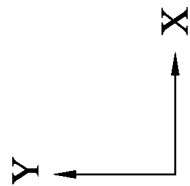

According to the structure of nanostructures of the wafer to be polished, the pad fractions may be formed in the shape of a cylinder, cube, triangular prism, pentagonal prism, hexagonal prism, polygonal prism, or other regular or irregular shapes as shown in FIG. 10. Different fraction shape may allow more locally uniform contact pressure between the wafer and the polishing pad as shown in FIG. 9.

Figure 11:
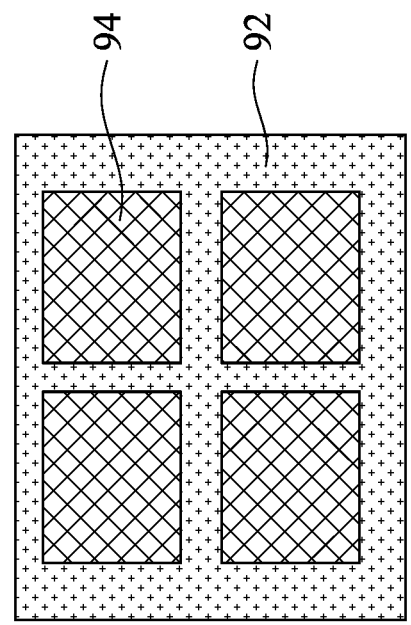
FIG. 11 shows an exemplary field design of a polishing pad according to one embodiment.
Figure 12:
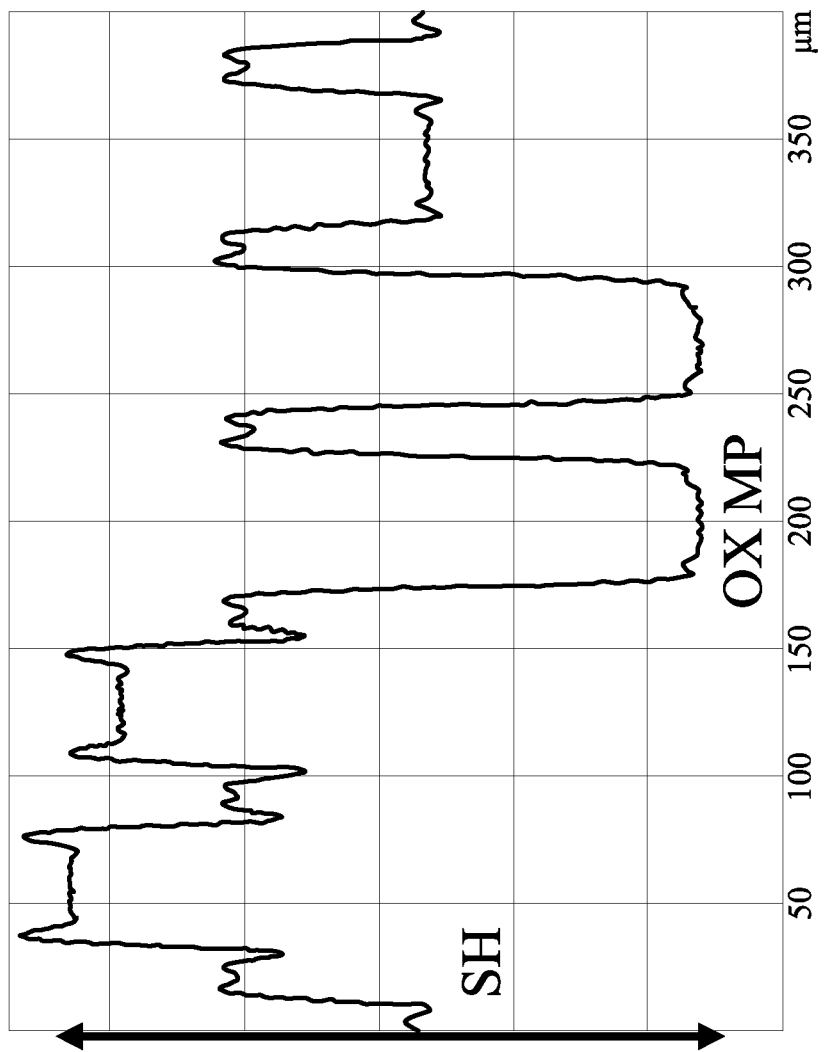
FIG. 12 shows the step height of an oxide layer subject to a CMP process.

FIG. 11 shows an exemplary design of at least a portion of a polishing pad with control at the pixel level. As shown the top view in FIG. 11, the 3D polishing pad structure 90 has a stack of first pad fraction 92 in the form of a field within which an array of four stacks of second pad fraction 94 are arranged. The first pad fraction 92 has a hardness softer than the hardness of the second fraction 94. In some embodiments, the 3D polishing pad structure 90 may be repeatedly formed throughout the polishing pad. In some other embodiments, the 3D polishing pad structure 90 may extend locally in a portion of the polishing pad, while other polishing pad structure may be formed in other portions of the polishing pad. FIG. 12 shows the surface profile of a wafer to be polished using a bulk polishing pad with the same hardness and the 3D polishing pad 90 as shown in FIG. 11. FIG. 12 shows the step height of an oxide layer of a wafer subject to a CMP process. The planarization efficiency using the traditional polishing pad and the 3D polishing pad 90 as shown in FIG. 11 can be calculated from the step height in shown in FIG. 12. The empirical data show a 58% improvement at the step height of 500 Å using the polishing pad 90.

Figure 13:
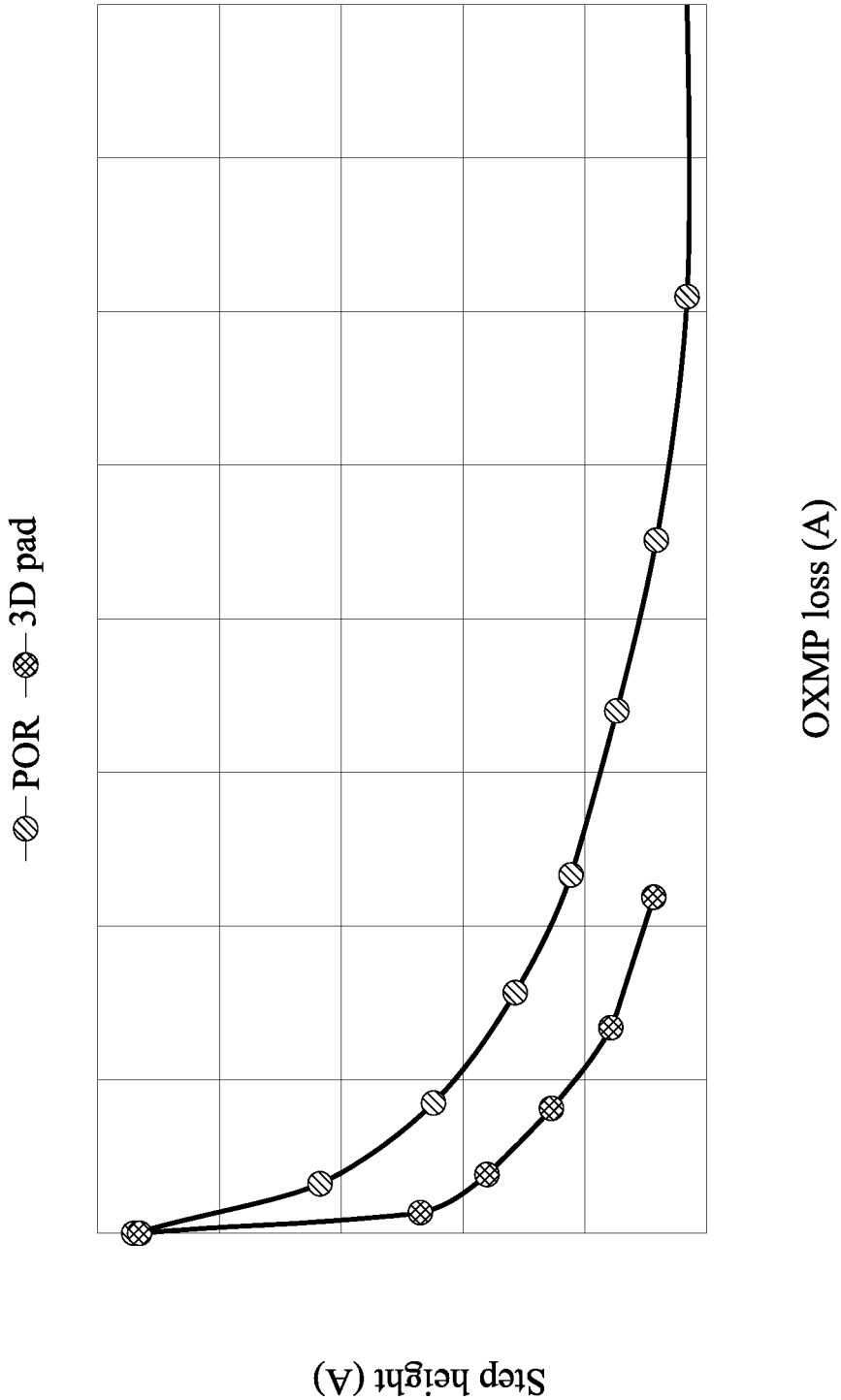
FIG. 13 shows the CMP removal rate of an oxide layer using two different polishing pads.

FIG. 13 shows a graph of CMP removal rate as a function of radial location R using both the traditional polishing pad and the new 3D polishing pad with a field design as shown in FIG. 11. When the traditional polish pad with uniform hardness is used, the removal rate RR (thickness removed per minute (Å/min)) at the radial location of R=10 mm may range from about 1400 Å to about 1500 Å. The range of the removal rate is about 100 Å. As shown in the graph, the range of removal rate RR increases as the radial location R approaches the edge of the wafer. While approaching the radial location at R=140 Å, the removal rate RR may range from about 1000 Å to about 1400 Å. Therefore, the uniformity of removal rate degrades as the R increases when a traditional polishing pad is used for the CMP process. In contrast, when the 3D polishing pad with different hardness arranged at different locations, the removal rate RR remain substantially constant of about 100 Å. Therefore, the 3D polishing pad provides significant improvement of uniformity in removal rate RR.

Figure 14:
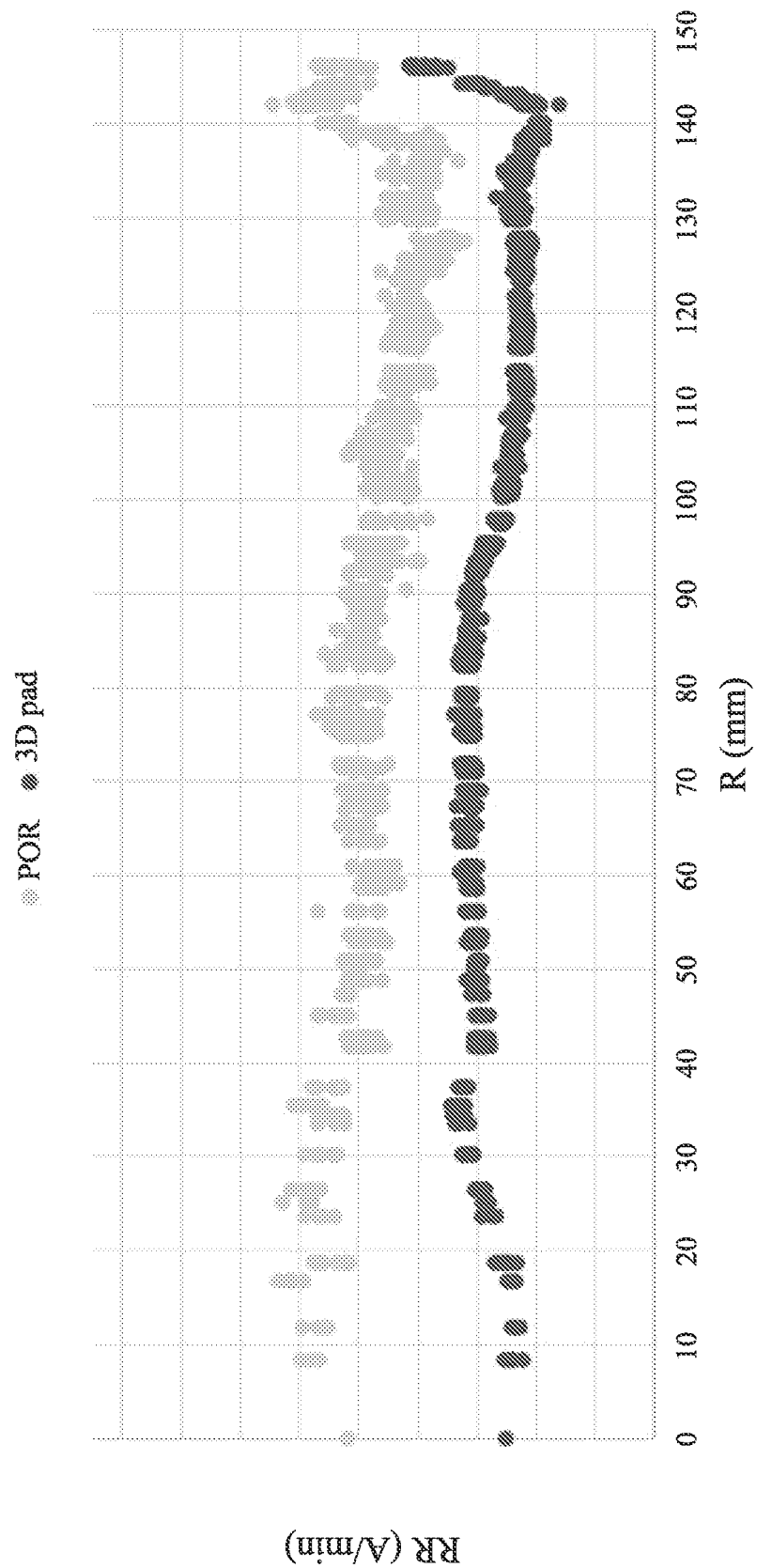
FIG. 14 is a chart showing the CMP removal rate of oxide along the radius of the wafer.
Figure 15:
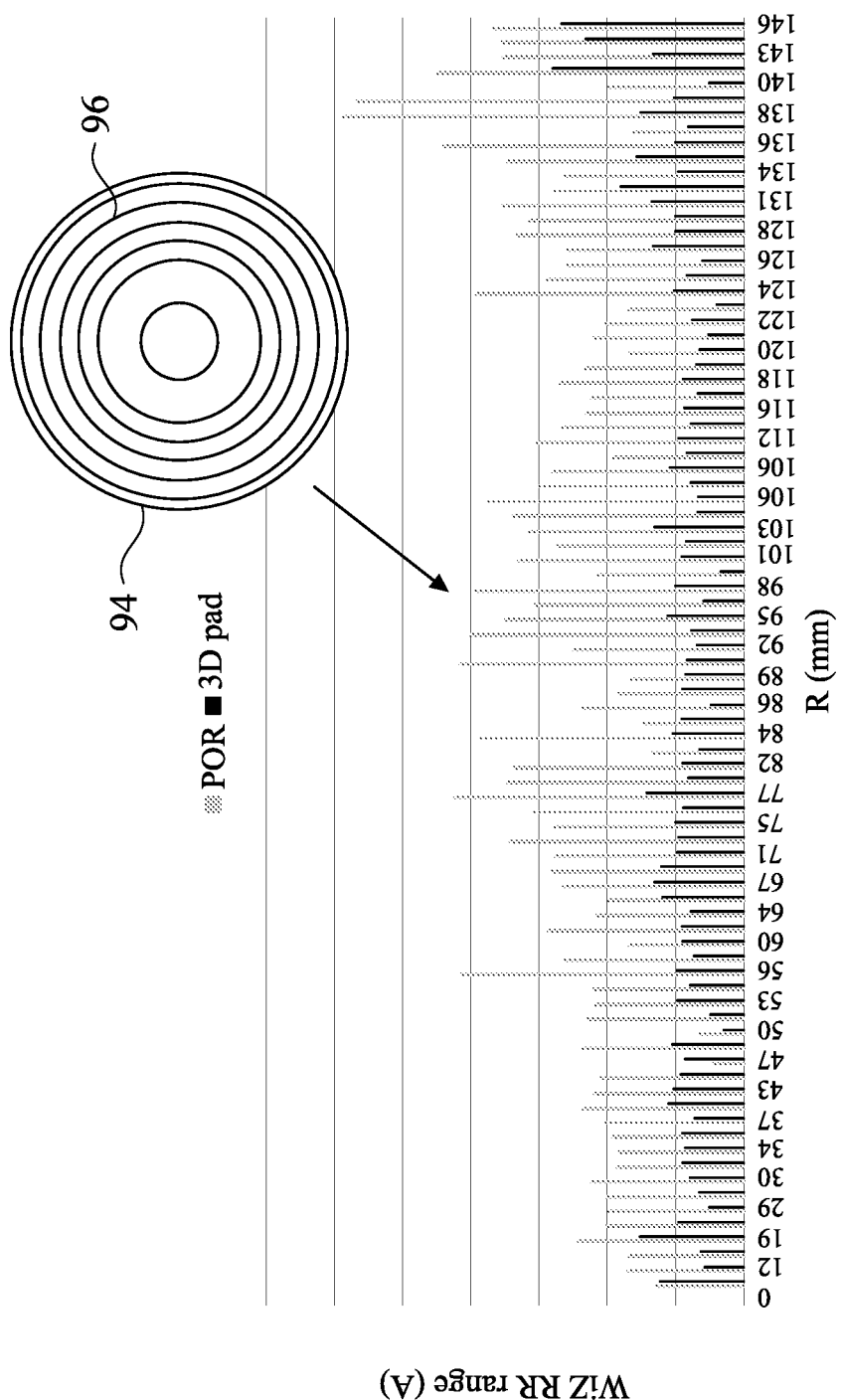
FIG. 15 shows the within zone removal rate of oxide along the radius of the wafer.

FIG. 14 shows the charts of ranges of within zone removal rate (WiZRR) as a function of the radial location R in wafers of CMP processes using both the traditional polishing pad and the 3D polishing pad 95 with a groove design 96 (See FIG. 15). The groove design 92 may include a segmental spiral groove that provides more fluent slurry distribution. As shown in the charts, the traditional polishing pad results in a randomly fluctuated within zone removal rate from R=0 Å to R=145 Å with the highest range of nearly 300 Å. In contrast, except from the edge of R=140 Å to 145 Å, the 3D polishing pad 100 with the spiral grooving design 102 provides a substantially consistent and small range of about 50 Å. The 3D polishing pad 95 with the segmental spiral groove 92 shows a 64% of improvement in uniformity.

Figure 16:
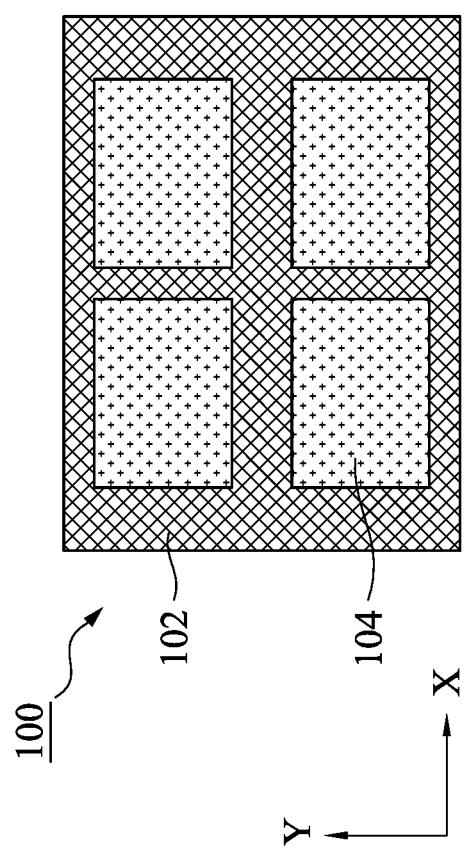
FIGS. 16-18 show various patterns of the pad fractions of a polishing pad according to some embodiments.
Figure 17:
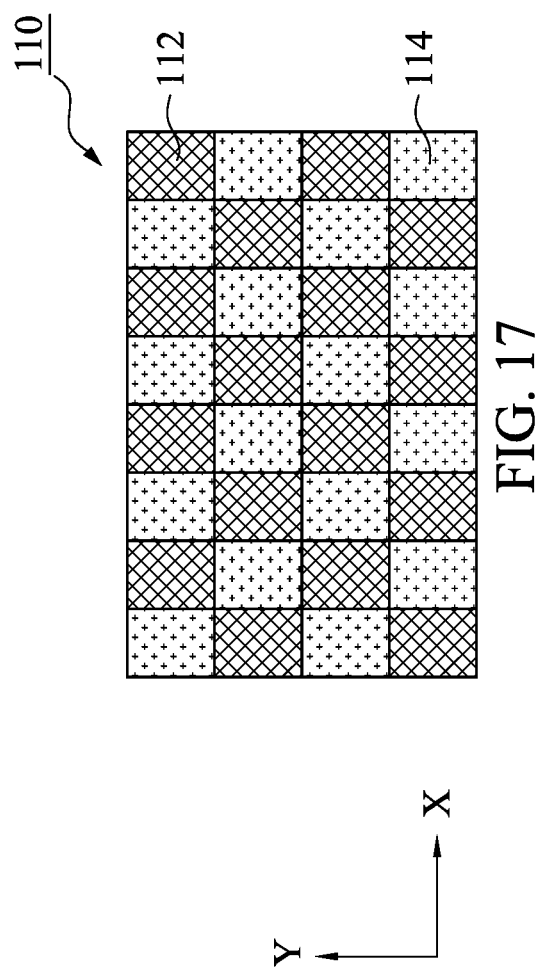
Figure 18:
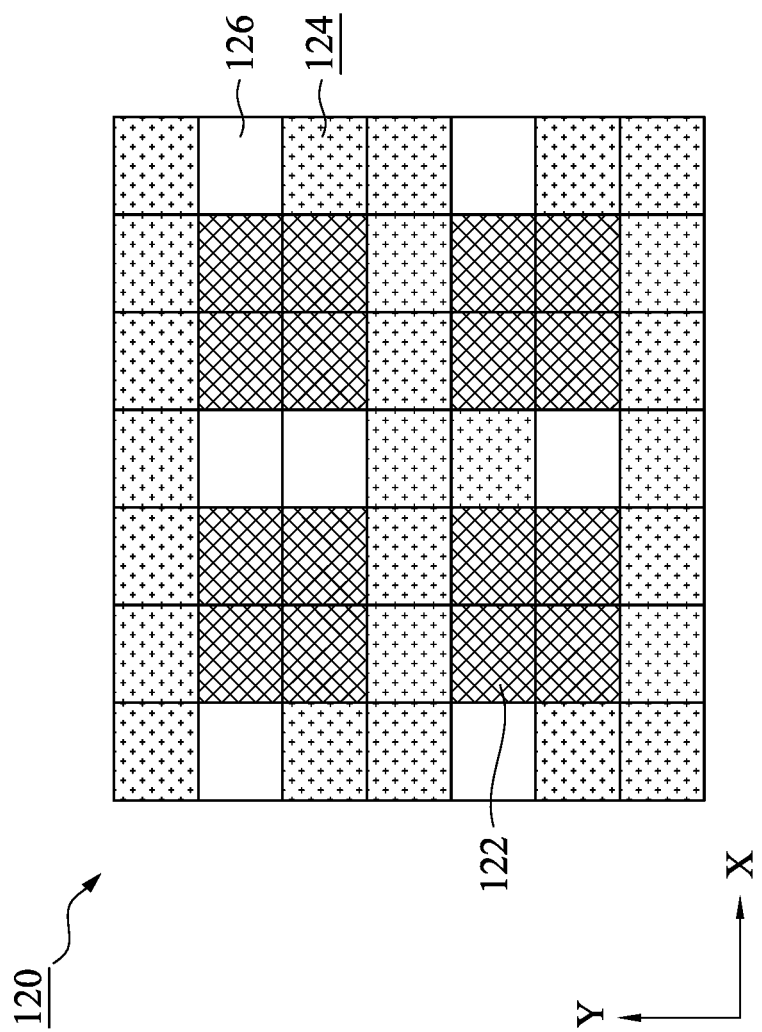

In addition to the field design as shown in FIG. 11, the polishing pad may be designed with various patterns according to the wafer topography and other process requirements. FIG. 16 shows the top view of a polishing pad structure 100 with similar structure as the polishing pad 90 as shown in FIG. 11. However, the polishing pad structure 100 has a field of pad fraction 102 with four hard fractions 104 arranged as a 2×2 matrix within the pad fraction 102. FIG. 17 shows a polishing pad structure 110 with hard pad fractions 112 and soft pad fractions 114 alternately arranged in a checker box pattern. In FIG. 18, the polishing pad 120 not only includes hard pad fractions 122 and soft pad fractions 124, but also the pore fractions 126. As shown in FIG. 18, two rows of mixtures of the pore fractions 126, the hard pad fractions 122, and the soft pad fractions 124 are arranged between each pair of neighboring rows of soft pad fractions 124. Each row of mixtures includes multiple pairs of immediately adjacent hard pad fractions 122 and the soft pad fractions 124 and the pore fractions 126 alternately arranged between the neighboring pairs of hard pad fractions 122.

Figure 19:
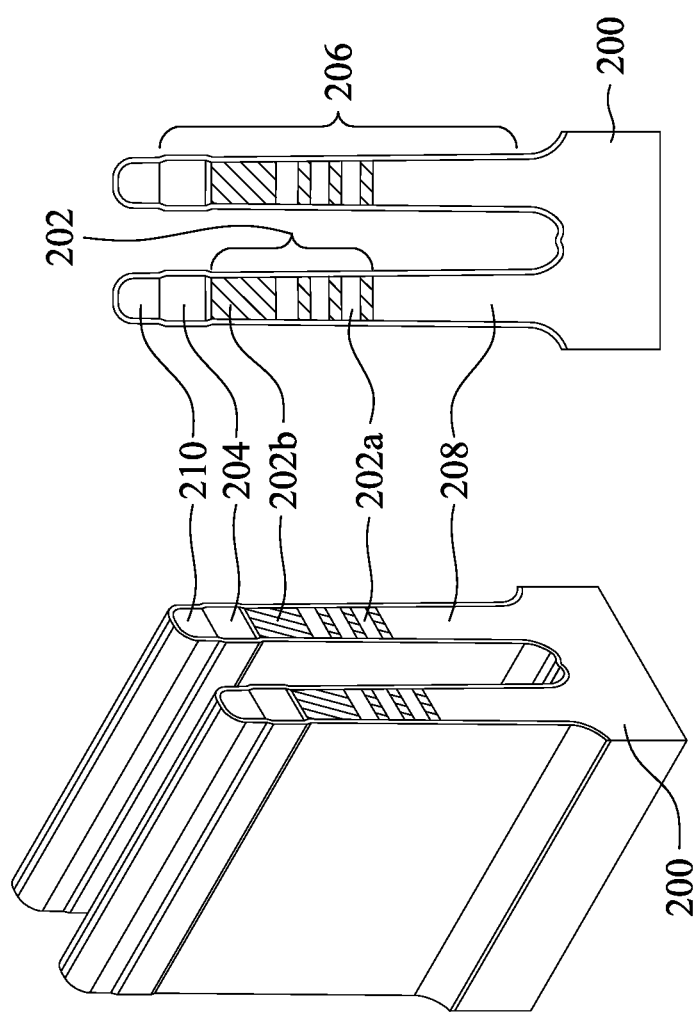
FIGS. 19-21 show a process for forming a shallow trench isolation (STI) using the CMP process for planarization.
Figure 20:
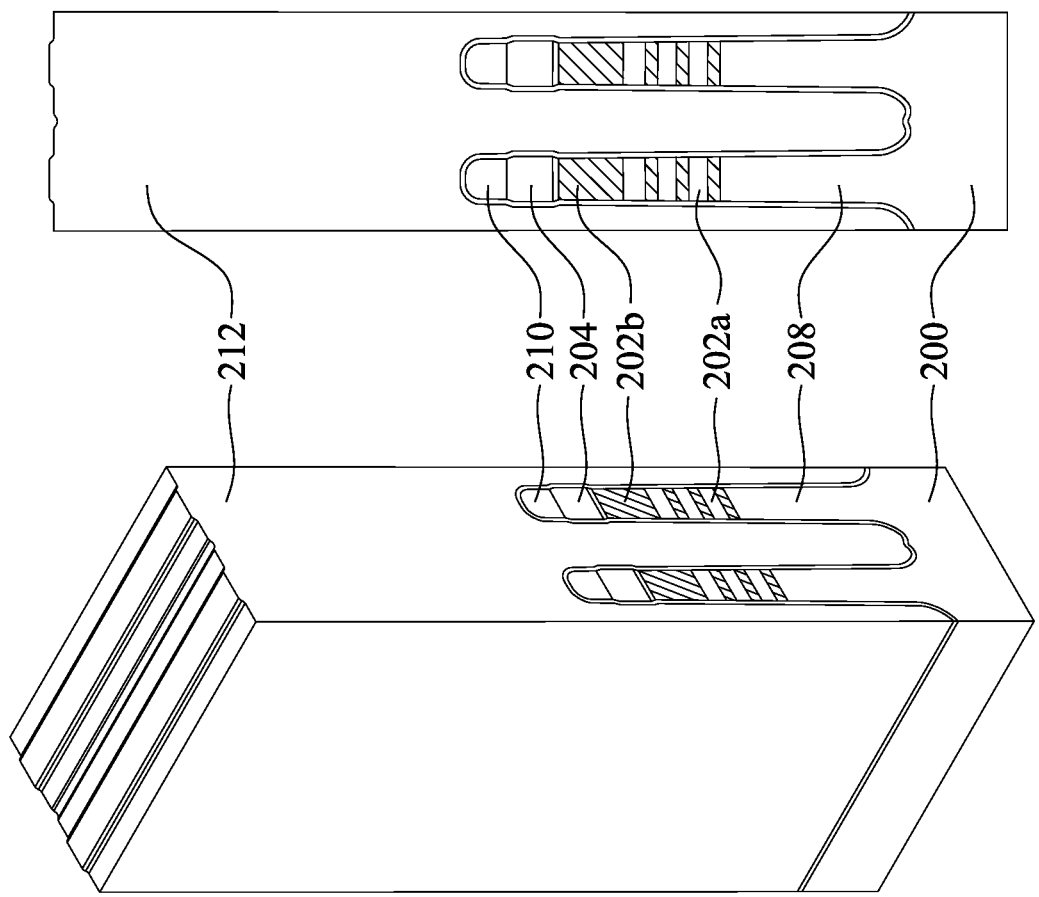
Figure 21:
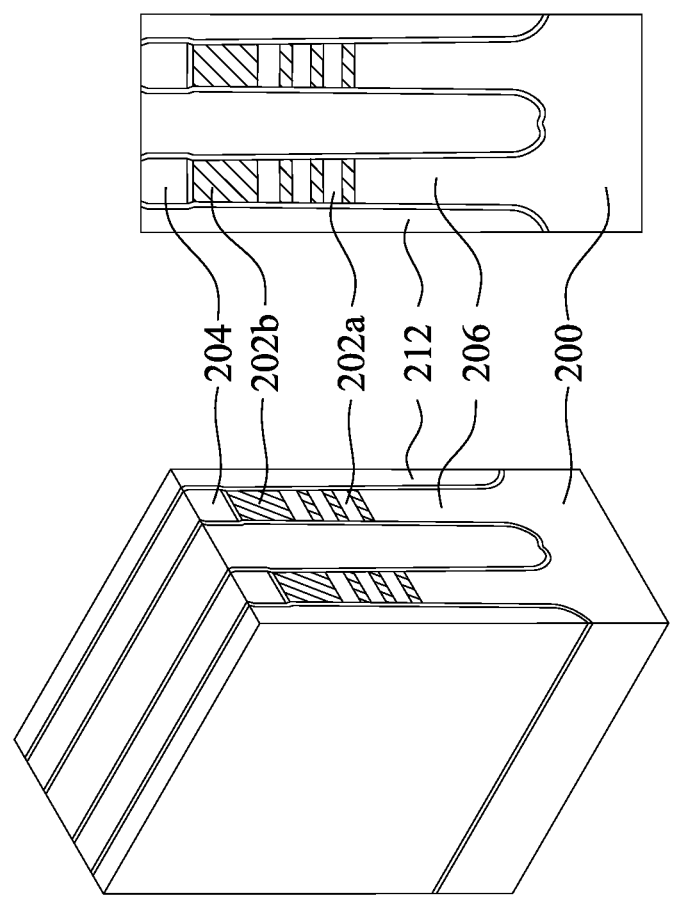

As discussed above, the CMP process with the 3D polishing pad may be applied to formation of various structures in a semiconductor device. FIGS. 19-21 show the process for forming a shallow trench isolation that may be used in a FET, a GAA device, and other nanosheet devices. Perspective views and cross-sectional views are provided in each of FIGS. 19-21. In FIG. 19, a substrate 200 is provided. According to one embodiment, the substrate 200 may be a semiconductor substrate. In some embodiments, the substrate 200 includes a single crystalline semiconductor layer on at least the surface of the substrate 200. The substrate 200 may include a single crystalline semiconductor material such as, but not limited to silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb) and indium phosphide (InP). In this embodiment, the substrate 200 is made of Si. In some embodiments, the substrate 200 is a silicon-on-insulator (SOI) substrate, which includes an insulating layer (not shown) disposed between two silicon layers. In one aspect, the insulating layer is an oxide.

One or more buffer layers (not shown) may be formed on the surface of the substrate 200. The buffer layers can serve to gradually change the lattice constant from that of the substrate to that of the source/drain (S/D) regions to be grown on the substrate 100. The buffer layers may be formed from epitaxially grown single crystalline semiconductor materials such as, but not limited to Si, Ge, germafnium tin (GeSn), SiGe, GaAs, InSb, GaP, GaSb, InAlAs, InGaAs, GaSbP, GaAsSb, GaN, GaN, and InP. In one embodiment, the substrate 200 includes SiGe buffer layers epitaxially grown on the silicon substrate 200. The germanium concentration of the SiGe buffer layers may increase from 30 atomic percent germanium for the bottom-most buffer layer to 70 atomic percent germanium for the top-most buffer layer. The substrate 200 may include various regions that have been suitably doped with impurities (e.g., p-type or n-type impurities). The dopants are, for example boron for an n-type field effect transistor FET (NFET) and phosphorus for a p-type FET (PFET).

A stack of semiconductor layers 202, including alternately formed first semiconductor layers 202a and second semiconductor layers 202b, is formed on the substrate 200. The first semiconductor layers 202a and the second semiconductor layers 202b are made of semiconductor materials having different etch selectivity and/or oxidation rates. For example, the first semiconductor layers 202a may be made of Si and the second semiconductor layers 102b may be made of SiGe. In some examples, the first semiconductor layers 202a may be made of SiGe and the second semiconductor layers 202b may be made of Si. Alternatively, in some embodiments, either of the semiconductor layers 202a and 202b may be or include other materials such as Ge, SiC, GeAs, GaP, InP, InAs, InSb, GaAsP, AlInAs, AlGaAs, InGaAs, GaInP, GaInAsP, or any combinations thereof. In the embodiment as shown in FIG. 19, the first semiconductor layers 202a are made of Si and the second semiconductor layers 202b is made of $Si_{1-x}Ge_x$ with x ranging between about 25% and about 50%.

The first semiconductor layers 202a or portions thereof may form nanosheet channel(s) of the semiconductor device structure in subsequent fabrication stages. The term nanosheet is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including, for example, a cylindrical in shape or substantially rectangular cross-section. The nanosheet channel(s) of the semiconductor device structure may be surrounded by a gate electrode. The semiconductor device structure may include a nanosheet transistor. The nanosheet transistors may be referred to as nanowire transistors, gate-all-around (GAA) transistors, multi-bridge channel (MBC) transistors, or any transistors having the gate electrode surrounding the channels. The use of the first semiconductor layers 202a to define a channel or channels of the semiconductor device structure.

The first and second semiconductor layers 202a and 202b may be formed by any suitable deposition process, such as epitaxy. For example, epitaxial growth of the layers of the stack of semiconductor layers 202 may be performed by a molecular beam epitaxy (MBE) process, a metalorganic chemical vapor deposition (MOCVD) process, and/or other suitable epitaxial growth processes. The semiconductor layers 202a may define the channels of an FET, such as a n-type FET (NFET) or the channels of a second FET, such as a p-type FET (PFET). The thickness of the first semiconductor layers 202a is chosen based on device performance considerations. In some embodiments, the second semiconductor layers 102b may eventually be removed and serve to define spaces for a gate stack to be formed therein.

In FIG. 19, the stack of semiconductor layers 202 includes three first semiconductor layers 202a and four second semiconductor layers 202b. It is appreciated that the numbers of the first and second semiconductor layers 202a and 202b in the stack of semiconductor layers 202 may vary depending on the desired number of nanosheet channels needed for the semiconductor structure.

A hard mask 204 may be formed on the stack of semiconductor layers 202. The hard mask 204 may include an oxygen-containing layer and a nitrogen-containing layer. The oxygen-containing layer may be a pad oxide layer, such as a $SiO_2$ layer. The nitrogen-containing layer may be a pad nitride layer, such as $Si_3N_4$. The hard mask 204 may be formed by any suitable deposition process, such as chemical vapor deposition (CVD) process or plasma enhance atomic layer deposition (PEALD). The stack of semiconductor layers 202, a portion of the substrate 200, and the hard mask 204 are then patterned to form into at least two fin structures 206. Each of the fin structures 206 includes the stack includes a well portion 208 formed by one of the patterned portion of the substrate 200 and one of the stacks of the semiconductor layers 202. A liner layer 210 such as an oxide liner may be conformally formed to cover the exposed surface of the fin structures 206.

In FIG. 20, a dielectric layer 212 is formed over the semiconductor structure as shown in FIG. 19 and filling the trenches between the fin structures 206. The dielectric layer 212 may include a silicon oxide deposited by processes such as high density plasma (HDP). The high-density plasma allows the deposition of oxide to fill small trenches without leaving voids therein. Other process such as chemical vapor deposition (CVD), plasma enhanced chemical vapor deposition (PECVD), or other similar processes may also be used for forming the oxide layer. The CMP process is then performed to remove the silicon oxide layer 212 with the hard mask layer 204 as an etch stop as the removal rate of the silicon nitride is about three times slower than the removal rate of silicon oxide. The CMP process is performed with a 3D polishing pad that includes an array of stacks of hard pad fractions, soft pad fractions, and pore fractions. In some embodiments, each of the hard pad fractions, the soft pad fractions, and the pore fraction may have a length of about 40 µm, a width of about 40 µm, and a height of about 5 µm. The dimension of each hard pad fractions, soft pad fractions, and pore fractions may be adjusted according to the topology of the wafer to be polished and other process parameters.

The polishing pad has a polishing surface that includes hard pad fractions arranged in locations to polish the portions of the oxide layer 212 that are easily to dish by CMP process. For example, the hard pad fractions are arranged to polish the trench oxide, that is, the oxide layer 212 filling and over the trenches between the fin structures 206. The polishing surface also includes soft pad fractions arranged to polish active oxide 212, for example, the oxide layer 212 over the fin structures 206 that are typically more resistant to dish effect. As a result, the CMP-induced defects can be minimized. The pore fractions are also arranged between the soft and hard pad fractions to allow the slurry to be introduced more fluently and efficiently to further enhance the polish uniformity. A substantially flat surface of the shallow trench isolation without significant dishing effect can thus be obtained as shown in FIG. 21.

In addition to the formation of dielectric structure such as STI as discussed above, CMP has also been widely used to form conductive structure, for example, to planarize the metal surface and define the metal line thickness in copper (Cu) back-end-of-line (BEOL) technology. Similar to oxide, CMP introduces undesirable undesired side effects, including dishing and scratching defects. The dishing effect may arise from the material property differences between dielectrics and metal under CMP process. The dishing effect may also arise from the hardness of the polishing pad used in the CMP process. Since Cu is softer than oxide, it is more sensitive to chemical slurry; and hence results in a faster polishing rate of Cu compared to its surrounding material such as silicon oxide. In addition, when a softer polishing pad is used, the force applied from the center of the polishing pad causes wafer in direct contact with the polishing pad to be pressed further than its edge. The dishing effect is more significant to the wider metal lines than to the narrow metal lines. Selection of a softer polishing pad furthers the dishing effect of Cu by CMP. However, when a harder polishing pad is selected, polishing defects increase significantly to seriously degrade the device performance.

In one embodiment, a 3D polishing pad made of an array of stacks of hard pad fractions, soft pad fractions, and pore fractions is used to perform CMP process on a conductive structure such a metal line in BEOL. The arrangements of the individual stacks of hard pad fractions, soft pad fractions, and pore fractions may be designed according to the specific layout of the BOEL structure. For example, the stacks of hard pad fractions may be arranged to polish the metal lines, while the stacks of soft pad fractions may be arranged to polish the dielectric layer surrounding the metal lines. The stacks of pore fractions may be arranged between the hard pad fractions and the soft fractions to result in a more fluent and efficient slurry supply. Examples of the arrangements of the stacks of hard pad fractions, soft pad fractions, and pore fractions can be referred to those as shown in FIGS. 7, 10, 15-17, and other patterns not shown in the figures.

A chemical mechanical polishing device is provided according to some embodiments. The chemical mechanical polishing device comprises a polishing pad. The polishing pad includes a plurality of stacks of first pad fractions and a plurality of stacks of second pad fractions. The first pad fractions and the second pad fractions have different hardness. The stacks of first pad fractions and the stacks of the second pad fractions are arranged with a pattern corresponding to a predetermined feature of a structure to be polished by the chemical mechanical polishing device. The predetermined feature may include a surface profile or a material of the structure to be polished.

The polishing pad may further comprise a plurality of pore fractions. Each of the pore fractions may have a length ranging from about 1 μm to about 1000 μm. The pore fractions may include water soluble hollow balls. The polishing pad may further comprise a plurality of the polishing layers stacked with each other. The pore fractions may be arranged between the first pad fractions ad the second pad fractions. Each of the first pad fractions and the second pad fractions may have a length ranging from about 1 μm to about 1000 μm. Each of the first pad fractions and the second pad fractions may have a width ranging from about 1 μm to about 1000 μm. Each of the first pad fractions and the second pad fractions has a height ranging from about 1 μm to about 100 μm. Each of the first pad fractions and the second pad fractions may have a shape of cylinders, rectangular prism, triangular prism, cube, pentagonal prism, hexagonal prism, or polygonal prism.

In one embodiment, the pattern includes a 2×2 matrix of the first pad fractions arranged within the second pad fractions. In another embodiment, the first pad fractions and the second pad fractions are arranged in a checker box format. The pattern may also comprise two rows of the first pad fractions, a row of a first mixture of the first second pad fractions, the second pad fractions, and a plurality of pore fractions, and a row of a second mixture of the first second pad fractions, the second pad fractions, and the pore fractions. The row of the first mixture and the row of the second mixture are arranged between the two rows of the first pad fractions.

In some embodiments, each of the first pad fractions may have a hardness ranging from about 40 Shore D to about 90 Shore D, and each of the second pad fractions may have a hardness ranging from about 30 Shore D to about 90 Shore D. The polishing pad may include about an array of 1×1 to 100×100 of the first pad fractions and an array of 1×1 to 100×100 of the second pad fractions.

A method of forming a polishing pad for a chemical mechanical polishing device is provided according to one embodiment. The method comprises depositing a first material, a second material, and a third material on a plane to form a pattern of a plurality of first pad fractions, second pad fractions, and pore fractions corresponding to a predetermined of feature of a material layer to be polished by the chemical mechanical polishing device. The depositing step is repeated at different planes until a predetermined number of the patterns is formed and stacked with each other. The first material has a hardness different from a hardness of the second material, and the third material for forming the pore fractions includes a water-soluble material.

The method may further comprises forming the first pad fractions, the second pad fractions, and the pore fractions in a shape of a cylinder, a triangular prism, a rectangular prism, a cube, a pentagonal prism, or a hexagonal prism. In some embodiments, a three-dimensional printing process may be used for depositing the first material, the second material, and the third material.

A method of forming a semiconductor device is provided according to some embodiments. The method comprises a step of forming a material layer on a substrate and a step of planarizing the material layer by a chemical mechanical process using a polishing pad having pattern of a plurality of pad fractions with different hardness corresponding to a predetermined feature of the material layer. The method may further comprise planarizing the material on a first area having a first pattern density with the pad fractions having a first hardness and planarizing the material on a second area having a second pattern density with the pad fractions having a second hardness. The first pattern density is higher than the second pattern density, and the first hardness is smaller than the second hardness.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A chemical mechanical polishing device, comprising:
   a polishing pad, comprising:
      a plurality of stacks of first pad fractions; and
      a plurality of stacks of second pad fractions, wherein the first pad fractions and the second pad fractions have different hardness, and the stacks of first pad fractions and the stacks of the second pad fractions are arranged with a pattern corresponding to a predetermined feature of a structure to be polished by the chemical mechanical polishing device.

2. The device of claim 1, wherein the polishing pad further comprises a plurality of stacks of pore fractions.

3. The device of claim 2, wherein each of the pore fractions has a length ranging from about 1 μm to about 1000 μm.

4. The device of claim 2, wherein the pore fractions include water soluble hollow balls.

5. The device of claim 1, wherein the predetermined feature includes a surface profile of the structure to be polished.

6. The device of claim 1, wherein the predetermined feature includes a material of the structure to be polished.

7. The device of claim 1, each of the first pad fractions and the second pad fractions has a length ranging from about 1 μm to about 1000 μm.

8. The device of claim 1, wherein each of the first pad fractions and the second pad fractions has a width ranging from about 1 μm to about 1000 μm.

9. The device of claim 1, wherein each of the first pad fractions and the second pad fractions has a height ranging from about 1 μm to about 100 μm.

10. The device of claim 1, wherein each of the first pad fractions and the second pad fractions has a front surface in a shape of cylinders, rectangular prism, triangular prism, cube, pentagonal prism, hexagonal prism, or polygonal prism.

11. The device of claim 1, wherein the pattern includes a 2×2 matrix of the first pad fractions arranged within the second pad fractions.

12. The device of claim 1, wherein the first pad fractions and the second pad fractions are arranged in a checker box format.

13. The device of claim 1, wherein the pattern comprises:
two rows of the first pad fractions;
a row of a first mixture of the first pad fractions, the second pad fractions, and a plurality of pore fractions; and
a row of a second mixture of the first pad fractions, the second pad fractions, and the pore fractions,
wherein the row of the first mixture and the row of the second mixture are arranged between the two rows of the first pad fractions.

14. The device of claim 1, wherein:
each of the first pad fractions has a hardness ranging from about 40 Shore D to about 90 Shore D; and
each of the second pad fractions has a hardness ranging from about 30 Shore D to about 90 Shore D.

15. The device of claim 1, wherein the polishing layer includes about:
an array of 1×1 to 100×100 of the first pad fractions; and
an array of 1×1 to 100×100 of the second pad fractions.

16. A chemical mechanical polishing device, comprising:
a polishing pad having a polishing surface, wherein the polishing surface includes a pattern, the pattern includes a plurality of first pad fractions, a plurality of second pad fractions, and a plurality of pore fractions, the plurality of first pad fractions includes a stack of first material, the plurality of second pad fraction includes a stack of second material, and the plurality of pore fractions includes a stack of third material, the first material has a hardness different from a hardness of the second material, and the third material includes a water-soluble material.

17. The device of claim 16, wherein the first pad fractions, the second pad fractions, and the pore fractions are in a shape of a cylinder, a triangular prism, a rectangular prism, a cube, a pentagonal prism, or a hexagonal prism.

18. The device of claim 16, wherein the polishing pad is formed using a three-dimensional printing process for depositing the first material, the second material, and the third material.

19. A chemical mechanical polishing device, comprising:
a polishing pad having a plurality of pad fractions arranged with a pattern, wherein the plurality of pad fractions include one or more first hard fractions having a first hardness and one or more second hard fractions having a second hardness, the first hardness is smaller than the second hardness, the first hardness is selected for planarizing a first substrate area having a first pattern density, and the second hardness is selected for planarizing a second substrate area having a second pattern density.

20. The device of claim 19, wherein the plurality of pad fractions further comprises one or more of pore fractions formed from a water-soluble material.

* * * * *